United States Patent
Natarajan et al.

(10) Patent No.: US 12,411,773 B2
(45) Date of Patent: Sep. 9, 2025

(54) HOST BANDWIDTH OPTIMIZED DATA STREAM MEMORY WRITES

(71) Applicant: SK Hynix NAND Product Solutions Corp., Rancho Cordova, CA (US)

(72) Inventors: Shankar Natarajan, Folsom, CA (US); Sriram Natarajan, Folsom, CA (US); Grzegorz Kowalczyk, Gdynia (PL)

(73) Assignee: SK Hynix NAND Product Solutions Corp., Rancho Cordova, CA (US)

( * ) Notice: Subject to any disclaimer, the term of this patent is extended or adjusted under 35 U.S.C. 154(b) by 33 days.

(21) Appl. No.: 18/201,943

(22) Filed: May 25, 2023

(65) Prior Publication Data
US 2024/0394193 A1    Nov. 28, 2024

(51) Int. Cl.
*G06F 12/0888*    (2016.01)

(52) U.S. Cl.
CPC .. *G06F 12/0888* (2013.01); *G06F 2212/1024* (2013.01)

(58) Field of Classification Search
CPC .............. G06F 12/0888; G06F 2212/1024
See application file for complete search history.

(56) References Cited

U.S. PATENT DOCUMENTS

| | | | |
|---|---|---|---|
| 2012/0179883 A1* | 7/2012 | Ma | G06F 13/1647 711/E12.001 |
| 2016/0335001 A1* | 11/2016 | Heller | G06F 3/0655 |
| 2017/0075591 A1* | 3/2017 | Espeseth | G06F 3/0652 |
| 2017/0192687 A1 | 7/2017 | Huo et al. | |
| 2017/0242583 A1 | 8/2017 | Yang et al. | |
| 2018/0260154 A1 | 9/2018 | Dronamraju et al. | |
| 2021/0096772 A1* | 4/2021 | Lee | G06F 3/0652 |
| 2021/0141722 A1 | 5/2021 | Byun | |
| 2022/0164134 A1 | 5/2022 | Lee | |

* cited by examiner

*Primary Examiner* — Francisco A Grullon
(74) *Attorney, Agent, or Firm* — Haley Guiliano LLP

(57) ABSTRACT

A system and related method, including memory and processing circuitry, which is to write data of a data stream. The memory includes a first memory portion of a first density and a second memory portion of a second density. The processing circuitry receives a write request. The processing circuitry is then to select to write the data to the first memory portion based on a characteristic of the data stream, wherein both the first memory portion and the second memory portion are available to be written to, and the processing circuitry then causes the data to be written to the first memory portion. The processing circuitry may select to write the data to the first memory portion based on a size of the data stream and/or based on a bandwidth of writing data of the data stream to the memory.

17 Claims, 5 Drawing Sheets

HOST BANDWIDTH OPTIMIZED DATA STREAM MEMORY WRITES

TECHNICAL FIELD

The present disclosure is directed to systems and methods for writing data of a data stream to a memory by host bandwidth optimized data stream memory writes based on characteristics of the data stream.

SUMMARY

In accordance with the present disclosure, systems and methods are provided for writing data of a data stream to a memory by host bandwidth optimized data stream memory writes based on characteristics of the data stream. The system and methods disclosed herein enable the preservation of valuable low-density memory (e.g., single-level cell (SLC) memory), which is used for data that should be accessed quickly. When the system receives write requests from an outside source (e.g., a host device), the system is to allocate system memory to store the data associated with the write requests. The system and methods disclosed herein use host bandwidth optimized data stream memory writes to reduce the likelihood of a large, slow data stream to occupy the valuable low-density memory. This improves the overall access latency and efficiency of the processing circuitry of a storage device (e.g., a solid-state drive device).

In some embodiments, the system (e.g., a storage device) is provided with a memory and processing circuitry that are communicatively coupled to each other. In some embodiments the system can be distributed between a storage device and another device separate from the storage device (e.g., a host device, such as a storage controller device), such as where the host device provides processing circuitry to implement at least some of the functionality described herein. In some embodiments, the processing circuitry receives write requests and signals from the host device. In some embodiments, the processing circuitry selects to write data associated with the write request to the first memory portion based on a characteristic of the data stream when each portion of the memory is available to be written to. The signal received by the processing circuitry may include data such as the characteristic of the data stream which is used by the processing circuitry in the selection to write the data associated with the write request to the first memory portion. The processing circuitry then writes the data associated with the write request to the first memory portion.

BRIEF DESCRIPTION OF THE DRAWINGS

The following description includes discussion of figures having illustrations given by way of example of implementations of embodiments of the disclosure. The drawings should be understood by way of example, and not by way of limitation. As used herein, references to one or more "embodiments" are to be understood as describing a particular feature, structure, and/or characteristic included in at least one implementation. Thus, phrases such as "in one embodiment" or "in an alternate embodiment" appearing herein describe various embodiments and implementations, and do not necessarily all refer to the same embodiment. However, they are also not necessarily mutually exclusive.

DETAILED DESCRIPTION

Figure 1:
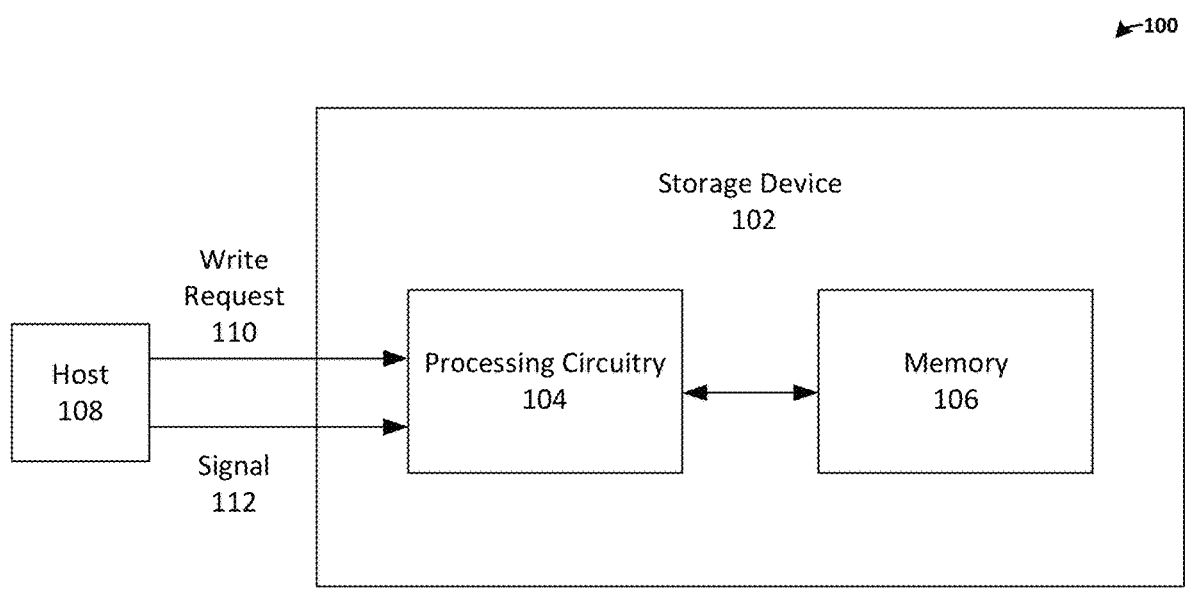
FIG. 1 shows an illustrative diagram of a system of a storage device with a processing circuitry and memory, in accordance with some embodiments of the present disclosure.

In accordance with the present disclosure, systems and method are provided for writing data of a data stream to a memory by host bandwidth optimized data stream memory writes based on characteristics of the data stream on a storage device (e.g., a solid-state drive (SSD) device). Conventionally, an SSD device may receive write requests and perform a write based on a low-density memory write first process, which prioritizes writing to a low-density memory regardless of the data stream of write requests. Low-density memory is useful for its quick access time. However low-density memory tends to be a small portion of mass storage memory, compared to high-density memory, which stores more data per memory cell. For example, an SSD device may have a memory that includes a first memory portion of single-level cells (SLCs) and a second memory portion of multi-level cells (MLCs). In some embodiments, the multi-level cells may include any one of dual-level cell (DLC) memory, triple-level cell (TLC) memory, quad-level cell (QLC) memory, penta-level cell (PLC) memory, or any other suitable memory that has a memory density greater than 5 bits per memory cell. If the processing circuitry of the SSD device prioritizes writes to low-density memory portions, the processing circuitry allocates memory in the first memory portion and writes data associated with the write requests to the allocated memory. In such an example, when the write requests are of a large, slow data stream, the processing circuitry still writes the data associated with the write requests to the SLCs of the first memory portion. However, if another data stream, which is small and faster than the previous data stream, is sent by a host device, the SLCs of the first memory portion may still be occupied, forcing the processing circuitry to write the small and faster data stream into the MLCs of the second memory portion, which causes unnecessary data access inefficiencies.

In order to improve the access efficiency of the SSD device, the processing circuitry may process received write requests based on a characteristic of the data stream associated with the write requests. In some embodiments, the write requests are sent by an outside source, such as a host device. In some embodiments, the characteristic of the data stream may be included in a signal sent by the host device. The characteristic of the data stream may include a size of the data stream or a bandwidth of writing data of the data stream to the memory. For example, when a data stream is large in size or is a low-bandwidth data stream, the processing circuitry writes the data associated with the write requests to the high-density MLCs of the second memory portion within the SSD device. Conversely, when the processing circuitry receives a data stream with a small volume of write requests or a high-bandwidth data stream, the processing circuitry then writes the data associated with the write requests to the low-density SLCs of the first memory portion within the SSD device.

In some embodiments, the processing circuitry may initially store the data associated with the write requests in a buffer or other suitable temporary memory in the SSD device. In some embodiments, the first memory portion may be used to buffer the write requests until the processing circuitry determines which portion of memory to store the data associated with the write requests of the whole data stream based on the characteristic of the data stream. For example, the processing circuitry may initially write data associated to write requests of a data stream to a first memory portion of SLCs, but once the processing circuitry determines that the data stream includes a large number of write requests (e.g., a large data stream size) or a low-bandwidth data stream, the processing circuitry may write the initially written data as well as any data from outstanding write requests to the second memory portion. This process of using host bandwidth optimized data stream memory writes based on characteristics of the data stream may be performed to write to a certain portion of memory until that portion of memory is exhausted.

In some embodiments, the memory of the system disclosed herein may contain at least two of the following memory densities: single-level cells (SLCs), dual-level cells (DLCs), triple-level cells (TLCs), quad-level cells (QLCs) and penta-level cells (PLCs). In some embodiments, the system may include more than two portions of memory, wherein each respective portion of memory has a different respective memory density. In some embodiments, the portions of memory may be distributed among at least two SSD devices.

For purposes of brevity and clarity, the features of the disclosure described herein are in the context of an SSD having processing circuitry and memory. However, the principles of the present disclosure may be applied to any other suitable context in which host bandwidth optimized data stream memory writes based on characteristics of the data stream is used. A storage device may include processing circuitry and memory and the processing circuitry and memory are communicatively coupled by a network bus or interface. In some embodiments, the processing circuitry receives data, which may be driven on a network bus or interface from a source outside of the storage device or may be transmitted from within the storage device (e.g., from memory).

In particular, the present disclosure provides systems and methods that use at least two portions of memory, each memory of a respective memory density and respective access time. The systems and methods leverage the at least two portions of memory by writing data associated to write requests to the portion of memory that closely matches the most efficient access times based on the size of the data stream and/or the bandwidth of writing data of the data stream to the memory. This improves the overall throughout of the system, by closely matching the access bandwidth from the system (e.g., an SSD device) to the host bandwidth of the data stream write requests received by the system.

For example, a user of the SSD device could download a large executable or movie file from the Internet or a portable storage device. Such a file tends to be slow, cumbersome streams that are large and sequential in nature and would consume valuable SLC or other low-density memory space. Host bandwidth optimized writes may solve this problem by having an outside source (e.g., a host) driver detect slow streams with large writes span and send a signal to hint to the processing circuitry of the SSD device to transfer the write requests to the QLC or other high-density memory space.

In some embodiments, a processor of the processing circuitry may be a highly parallelized processor capable of handling high bandwidths of incoming data quickly (e.g., by starting simultaneous processing of write requests before completion of previous write requests).

In some embodiments the system and methods of the present disclosure may refer to a storage device system (e.g., an SSD storage system), which includes a storage device such as a solid-state drive device, which is communicatively coupled to the processing circuitry by a network bus or interface.

An SSD is a data storage device that uses integrated circuit assemblies as memory to store data persistently. SSDs have no moving mechanical components, and this feature distinguishes SSDs from traditional electromechanical magnetic disks, such as, hard disk drives (HDDs) or floppy disks, which contain spinning disks and movable read/write heads. Compared to electromechanical disks, SSDs are typically more resistant to physical shock, run silently, have lower access time, and less latency.

Many types of SSDs use NAND-based flash memory which retain data without power and include a type of non-volatile storage technology. Quality of Service (QOS) of an SSD may be related to the predictability of low latency and consistency of high input/output operations per second (IOPS) while servicing read/write input/output (I/O) workloads. This means that the latency or the I/O command completion time needs to be within a specified range without having unexpected outliers. Throughput or I/O rate may also need to be tightly regulated without causing sudden drops in performance level.

The subject matter of this disclosure may be better understood by reference to FIGS. 1-5.

FIG. 1 shows an illustrative diagram of a system 100 of a storage device 102 with a processing circuitry 104 and memory 106, in accordance with some embodiments of the present disclosure. In some embodiments, storage device 102 may be a solid-state storage device (e.g., a solid-state drive device). In some embodiments, processing circuitry 104 may include a processor or any suitable processing unit. In some embodiments, memory 106 may be non-volatile memory. It will be understood that the embodiments of the present disclosure are not limited to SSDs. For example, in some embodiments, the storage device 102 may include a hard disk drive (HDD) device in addition to or in place of an SSD. In some embodiments, system 100 includes a host 108, which communicates with the storage device 102.

In some embodiments, the processing circuitry 104 is configured to receive write requests 110 and/or signals 112, where the write request 110 includes data and a memory address where to write the data of the write request 110. In some embodiments, the signals 112 are indicative of a characteristic of the data stream, such as the volume of data associated with the data stream write requests 110 or the host bandwidth of sequential write requests. In some embodiments, write requests 110 and signals 112 are transmitted on a network bus or interface to the processing circuitry 104. In some embodiments, write requests 110 is transmitted from an external source (e.g., host 108). In some embodiments, the processing circuitry 104 receives data (e.g., write requests 110 and signals 112) from both internal and external sources of the storage device 102. There may also be a temporary memory (e.g., a cache or queue) disposed within the processing circuitry 104, the temporary memory configured to store any outstanding data that is to be processed by the processing circuitry 104.

Additionally, storage device 102 includes memory 106. In some embodiments, memory 106 includes any one or more of a non-volatile memory, such as Phase Change Memory (PCM), a PCM and switch (PCMS), a Ferroelectric Random Access Memory (FeRAM), or a Ferroelectric Transistor Random Access Memory (FeTRAM), a Memristor, a Spin-Transfer Torque Random Access Memory (STT-RAM), and a Magnetoresistive Random Access Memory (MRAM), any other suitable memory, or any combination thereof. In some embodiments, memory 106 includes a first memory portion and a second memory portion, each portion of their own respective memory density (e.g., a first memory density and a second memory density). The first memory portion of memory 106 may be implemented as a cache for the second memory portion. In some implementations, the first memory density is less than the second memory density. For example, the first memory portion includes a single-level cell (SLC) memory, and the second memory portion includes a multi-level cell (MLC) memory, such as a dual-level cell (DLC) memory, triple-level cell (TLC) memory, quad-level cell (QLC) memory, penta-level cell (PLC) memory, or any other suitable memory that has a memory density greater than 5 bits per memory cell. In some embodiments, processing circuitry 104 is communicatively coupled to memory 106, in order to store and access data corresponding to write requests 110. In some embodiments, a data bus interface is used to transport write requests 110 or data associated with the write requests 110. The data bus between the memory 106 and processing circuitry 104 provides a network bus for accessing or writing of data to memory 106 (e.g., any one portion of memory 106). In some embodiments, the processor or processing unit of processing circuitry 104 may include a hardware processor, a software processor (e.g., a processor emulated using a virtual machine), or any combination thereof. The processor, also referred to herein as processing circuitry 104, may include any suitable software, hardware, or both for controlling the memory 106 and the processing circuitry 104. In some embodiments, the storage device 102 may further include a multi-core processor. Memory 106 may also include hardware elements for non-transitory storage of instructions, commands, or requests.

The processing circuitry 104 is configured to perform host bandwidth optimized data stream memory writes based on characteristics of the data stream, where the characteristics of the data stream may include the size of the data stream and bandwidth of writing data of the data stream to the memory. In addition, the processing circuitry 104 may receive signals 112 from host 108. The signals 112 are indicative of the characteristics of the data stream which may be used to determine whether to perform host bandwidth optimized data stream memory writes. Once the processing circuitry 104 receives the signal 112, the processing circuitry sets a flag bit, which when set, indicates that the processing circuitry 104 is using host bandwidth optimized data stream memory writes on write requests 110 received. The host bandwidth optimized data stream memory writes will ensure that the processing circuitry 104 stores data in portions of memory 106 which have a larger memory density than other portions of memory 106. The host bandwidth optimized data stream memory writes, completed by the processing circuitry 104, improves write performance of the storage device 102 and reserves valuable portions of memory 106, which have lower memory densities, which are not necessary for large, slow sequential streams of data. Even when all portions of memory 106 are available, the processing circuitry 104 causes the data to be written to a portion of greater memory density in order to preserve the valuable portion of memory 106 for smaller, quick streams of data.

Storage devices (for example, SSD devices) may include one or more packages of memory dies (e.g., memory 106), where each die includes storage cells. In some embodiments, the storage cells are organized into pages, and pages are organized into blocks. Each storage cell can store one or more bits of information. In some embodiments, the portions of memory wherein each respective portion of memory has a respective density of memory may be distributed among the one or more packages of memory dies.

It will be understood that, while system 100 depicts an embodiment in which a storage device 102 is configured to have capabilities for writing data of a data stream to a memory by host bandwidth optimized data stream memory writes based on characteristics of the data stream in accordance with the present disclosure, any other suitable device may be implemented in a similar manner.

For purposes of clarity and brevity, and not by way of limitation, the present disclosure is provided in the context of writing data of a data stream to a memory by host bandwidth optimized data stream memory writes based on characteristics of the data stream, which provides the features and functionalities disclosed herein. The process of writing data of a data stream to a memory by host bandwidth optimized data stream memory writes based on characteristics of the data stream may be configured by any suitable software, hardware, or both for implementing such features and functionalities. Writing data of a data stream to a memory by host bandwidth optimized data stream memory writes based on characteristics of the data stream may be at least partially implemented in, for example, storage device 102 (e.g., as part of processing circuitry 104, or any other suitable device). For example, for a solid-state storage device (e.g., storage device 102), host bandwidth optimized data stream memory writes based on characteristics of the data stream may be implemented in processing circuitry 104.

Figure 2:
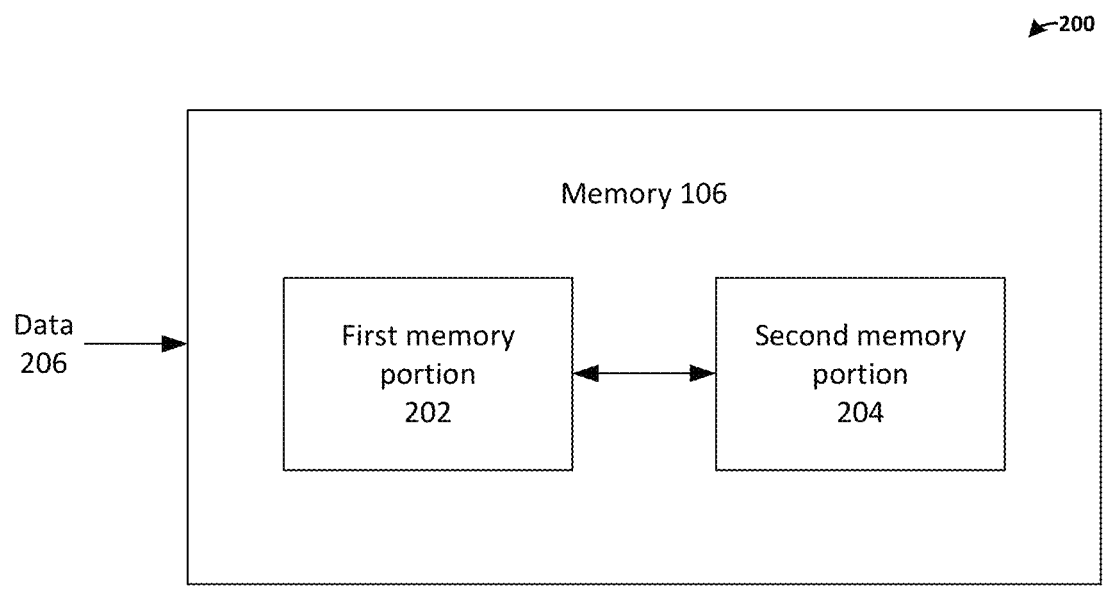
FIG. 2 shows an illustrative diagram of memory shown in FIG. 1, with the memory including a first memory portion and a second memory portion, in accordance with some embodiments of the present disclosure.

FIG. 2 shows an illustrative diagram of memory system 200, including memory 106 shown in FIG. 1, with the memory 106 including a first memory portion 202 and a second memory portion 204, in accordance with some embodiments of the present disclosure.

The first memory portion 202 is of a first memory density and performs reads/writes at a first access time and the second memory portion 204 is of a second memory density and performs reads/writes at a second access time. In some embodiments of memory 106, there may be more than two memory portions. For example, in another embodiments of memory system 200, memory 106 also includes a third memory portion (not shown) of a third memory density and a third access time to perform read and writes. In some embodiments, memory 106 may contain at least two of the following memory densities: single-level cells (SLCs), dual-level cells (DLCs), triple-level cells (TLCs), quad-level cells (QLCs), penta-level cells (PLCs), and any other suitable memory that has a memory density greater than 5 bits per memory cell. In some embodiments, memory 106 include more than two portions of memory, wherein each respective portion of memory has a different respective memory density. In some embodiments, the portions of memory may be distributed among at least two SSD devices.

The first memory portion 202 of memory 106 may be implemented as a cache for the second memory portion. In some implementations, the first memory density is less than the second memory density. For example, the first memory portion 202 includes a single-level cell (SLC) memory and the second memory portion 204 includes a multi-level cell (MLC) memory, such as a dual-level cell (DLC) memory, triple-level cell (TLC) memory, quad-level cell (QLC) memory, penta-level cell (PLC) memory, or any other suitable memory that has a memory density greater than 5 bits per memory cell. In some embodiments, each memory portion (e.g., first memory portion 202 and second memory portion 204) is communicatively coupled with each other memory portion in memory 106, in order to store and access data corresponding to write requests 110 or move data corresponding to a respective write request between each memory portion (e.g., from the first memory portion 202 to the second memory portion 204, or from the second memory portion 204 to the first memory portion 202). In some embodiments, data 206 may include data corresponding to a respective write request 110, as well as control data to enable the memory to store the data corresponding to the respective write request to the selected memory portion. In some embodiments, data 206 has been sent form the processing circuitry 104. In some embodiments, a data bus memory interface is used to transport data associated with the write requests 110. The data bus memory interface between the first memory portion 202 and the second memory portion 204 provides a memory network bus for accessing or writing of data between each memory portion (e.g., the first memory portion 202 and the second memory portion 204).

In some embodiments, memory 106 includes any one or more of a non-volatile memory, such as Phase Change Memory (PCM), a PCM and switch (PCMS), a Ferroelectric Random Access Memory (FeRAM), or a Ferroelectric Transistor Random Access Memory (FeTRAM), a Memristor, a Spin-Transfer Torque Random Access Memory (STT-RAM), and a Magnetoresistive Random Access Memory (MRAM), any other suitable memory, or any combination thereof. In some embodiments, memory 106 may include a separate write request cache or other suitable volatile memory to temporarily store write requests before they are processed by the processing circuitry 104. In some embodiments, memory 106 may also include hardware elements for non-transitory storage of instructions, commands, or requests.

Figure 3A:
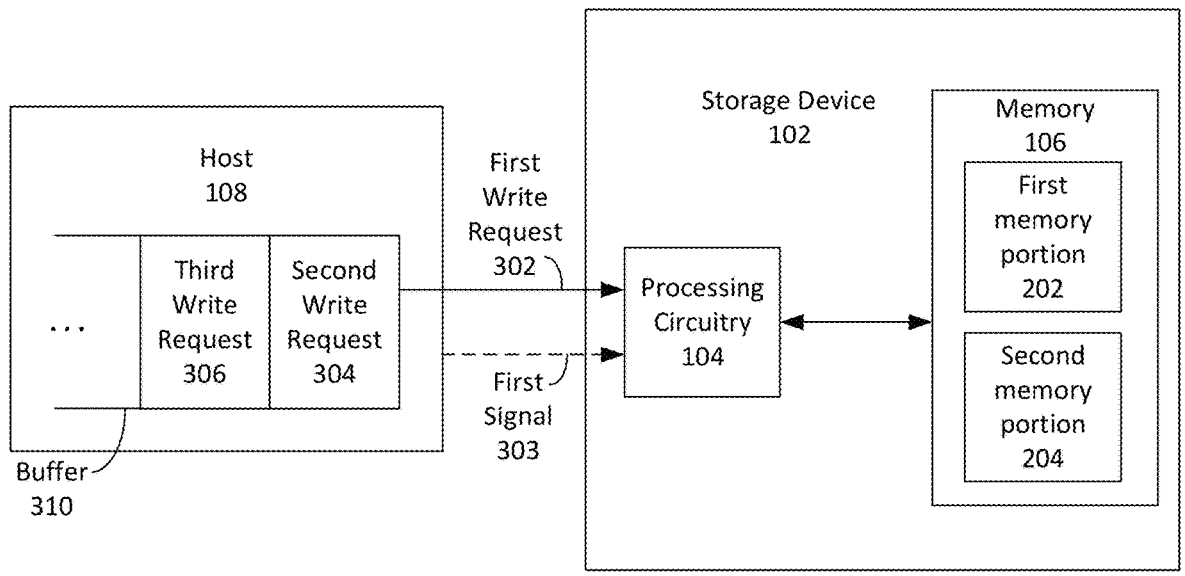
FIGS. 3A and 3B show illustrative diagrams of a system performing host bandwidth optimized data stream memory writes, in accordance with some embodiments of the present disclosure.
Figure 3B:
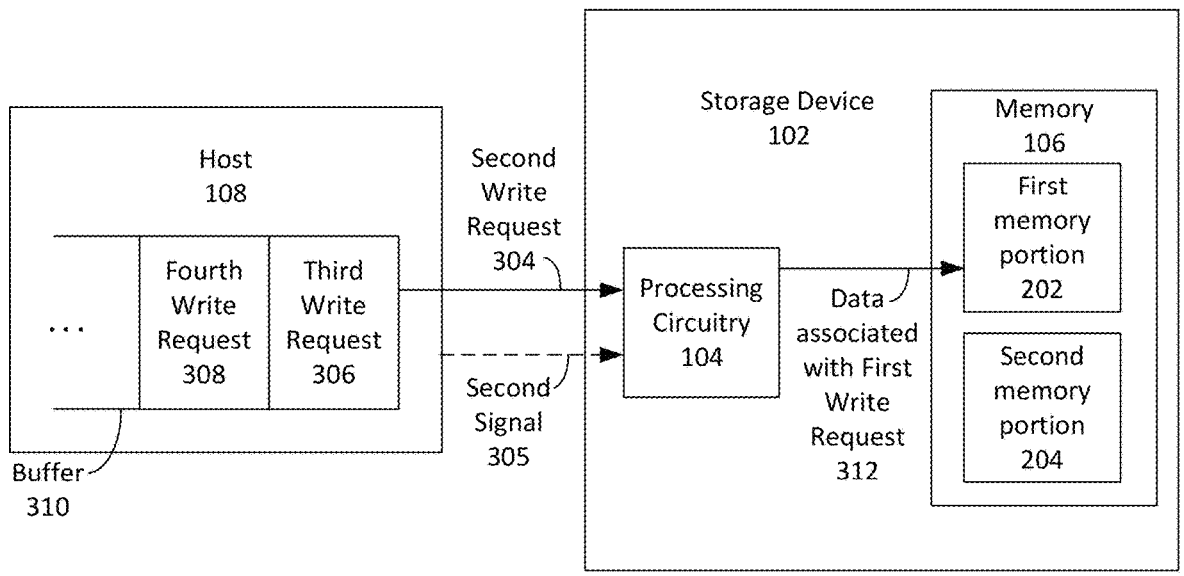

FIGS. 3A and 3B show illustrative diagrams of a system at two instances (e.g., a first instance 300 and a second instance 301) performing host bandwidth optimized data stream memory writes, in accordance with some embodiments of the present disclosure. In some embodiments, storage device 102 may be a solid-state storage device (e.g., a solid-state drive device).

In some embodiments, the system includes a host 108, which communicates with the storage device 102. The host 108 may include buffer 310, which stores the data stream of write requests (i.e., first write request 302, second write request 304, third write request 306, and fourth write request 308) that are to be driven to the storage device 102. Buffer 310 may be implemented as a stack, queue, or any other suitable temporary storage memory. In some implementations, host 108 drives a signal (e.g., first signal 303 or second signal 305) to the storage device 102, where the signal may include data such as the characteristic of the data stream. This signal data may be used by the processing circuitry 104 in the selection to write the data associated with a respective write request to either of the first memory portion 202 or the second memory portion 204.

In some embodiments, memory 106 may be non-volatile memory. The first memory portion 202 of memory 106 may be implemented as a cache for the second memory portion. In some implementations, the first memory density is less than the second memory density. For example, the first memory portion 202 includes a single-level cell (SLC) memory and the second memory portion 204 includes a multi-level cell (MLC) memory, such as a dual-level cell (DLC) memory, triple-level cell (TLC) memory, quad-level cell (QLC) memory, penta-level cell (PLC) memory, or any other suitable memory that has a memory density greater than 5 bits per memory cell.

FIG. 3A shows the system at a first instance 300, where host 108 drives the first write request 302 to the storage device 102. The first write request 302 is received by processing circuitry 104. In some implementations, host 108 drives a first signal 303, which includes data corresponding to the first write request 302. The first write request 302 is one write request of a data stream of write requests, including the second write request 304, the third write request 306, a fourth write request 308. At the first instance 300, processing circuitry 104 processes the first write request 302 with or without the data included in first signal 303.

FIG. 3B shows the system at a second instance 301, where processing circuitry 104 selects to write the data associated with first write request 312 to the first memory portion 202 based on characteristics of the data stream of write requests, including characteristics of the first write request 302. Processing circuitry 104 then causes the data associated with first write request 312 to be written to the first memory portion. Concurrently, at second instance 301, host 108 may drive the second write request 304 to the storage device 102 to be received by processing circuitry 104. In some implementations, the buffer 310 is used as a first-in-first-out queue, wherein the head of the buffer is dequeued and is driven to the storage device 102. In some implementations, the second write request 304 may be accompanied by a second signal 305. In some embodiments, the data associated with second write request (not shown) is written to the first memory portion 202, and the data associated with each subsequent write request of the data stream of write requests (e.g., third write request 306, fourth write request 308, etc.) is to be written to the first memory portion 202 while memory space remains available in the first memory portion 202.

In some embodiments, processing circuitry 104 may cause the data associated with the write requests (including data 312) to be written to the second memory portion 204 based on the characteristics of the data stream of write requests (e.g., first write request 302, second write request 304, third write request 306, and fourth write request 308), including the data of the first signal 303 and the second signal 305. In such embodiments, the data stream of the write requests may be a large, slow data stream, one in which the processing circuitry determines is to be stored in the more densely-packed second memory portion 204.

Figure 4:
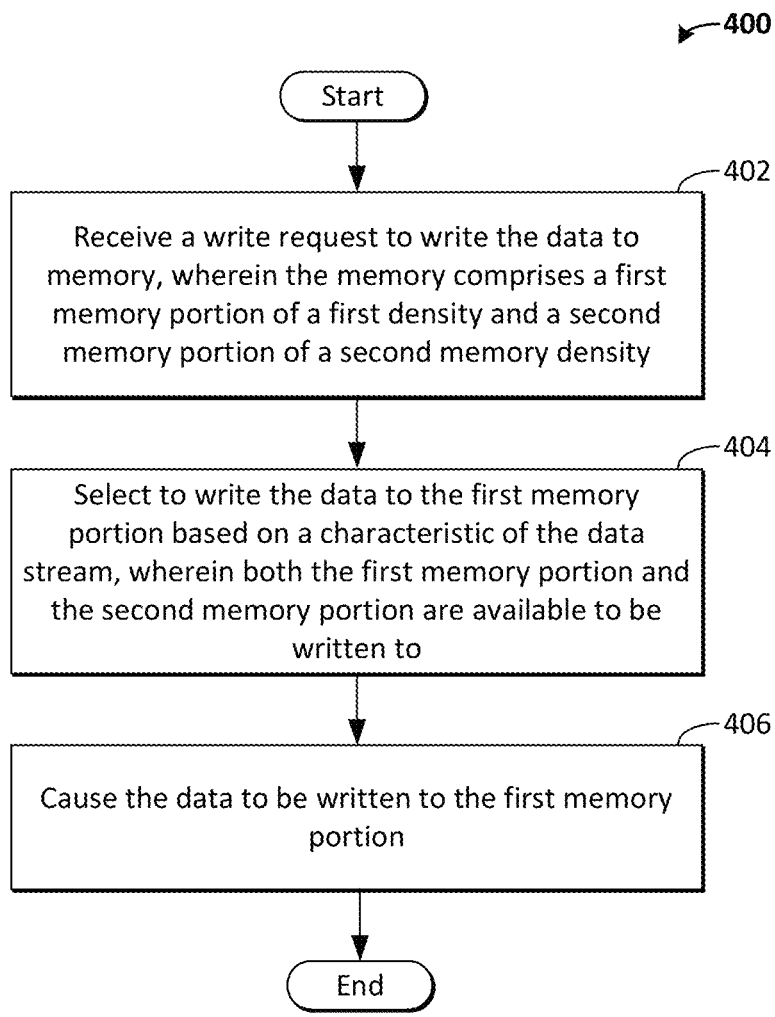
FIG. 4 shows a flowchart of illustrative steps for performing host bandwidth optimized data stream memory writes based on characteristics of the data stream, in accordance with some embodiments of the present disclosure.

FIG. 4 shows a flowchart 400 of illustrative steps for performing host bandwidth optimized data stream memory writes based on characteristics of the data stream, in accordance with some embodiments of the present disclosure. In some embodiments, the referenced storage device, processing circuitry, memory, first memory portion, second memory portion, host, write request, and signal may be implemented as storage device 102, processing circuitry 104, and memory 106, first memory portion 202, second memory portion 204, host 108, write request 110, and signal 112, respectively. In some embodiments, the process 400 can be modified by, for example, having steps rearranged, changed, added, and/or removed.

At step 402, the processing circuitry receives a write request to write data to memory, wherein the memory 106 includes a first memory portion of a first density and a second memory portion of a second memory density. In some embodiments, the write request is received, by the processing circuitry, from a network bus or interface. In some embodiments, the received write request is one of at least two write requests of a data stream. For example, the processing circuitry receives a write request sent from an outside source, such as a host. In some embodiments, the memory may include a third memory portion of a third memory density. In some embodiments, the storage device receives more than one write request. At least one of the received write request may be stored in the memory or a temporary memory, such as a cache or queue, or any form of volatile memory. In some embodiments, the processing circuitry may include a multi-core processor which can perform host bandwidth optimized writes. Once the processing circuitry receives a write request the processing circuitry selects to write the data to the first memory portion based on a characteristic of the data stream, wherein both the first memory portion and the second memory portion are available to be written to, at step 404.

At step 404, the processing circuitry selects to write the data to the first memory portion based on a characteristic of the data stream, when both the first memory portion and the second memory portion are available to be written to. In some embodiments, if one of the portions of memory is not available to be written to, the processing circuitry is configured to write data associated with the write requests to the available memory portion. In some embodiments the processing circuitry may process received write requests based on a characteristic of the data stream. In some embodiments, the write requests are sent by an outside source, such as a host device (e.g., host 108). In some embodiments, the characteristic of the data stream may be included in a separate signal sent by the host device. The characteristic of the data stream may include a size of the data stream or a bandwidth of writing data of the data stream to the memory. For example, when a data stream is large in size or is a low-bandwidth data stream, the processing circuitry writes the data associated with the write requests to the high-density MLCs of the second memory portion within the SSD device. Conversely, when the processing circuitry receives a data stream with a small volume of write requests or a high-bandwidth data stream, the processing circuitry then writes the data associated with the write requests to the low-density SLCs of the first memory portion within the SSD device. Once the processing circuitry selects to write the data to the first memory portion based on a characteristic of the data stream, when both the first memory portion and the second memory portion are still available to be written to, the processing circuitry then causes the data to be written to the first memory portion, at step 406.

At step 406, processing circuitry causes the data to be written to the first memory portion. The processing circuitry is configured to process the write request and write the data associated with the write request to memory. In some embodiments, the processing circuitry writes the data associated with the write request to the first available memory address in the selected memory portion, such as the first memory portion. In some embodiments, the first memory portion may not have any unused memory space. However, some of the used memory space of the first memory portion may store dirty data, which may not be relevant or needed any longer. Dirty data stored at a respective memory address of the first memory portion may be overwritten in order to clear the old or invalid data, and open memory space to store the data associated with the write request, which is new and more likely to be used. In other embodiments, the processing circuitry may determine to overwrite data of memory addresses in a memory portion selected to be written to based on a first-in-first-out process, a least recently used process, optimal page replacement process, random replacement, or a combination thereof. In some embodiments, the processing circuitry may select to write the data to the second memory portion based on the characteristics of the data stream, when both the first memory portion and the second memory portion are available to be written to. In such an embodiment, in a comparable manner of causing the data to be written to the first memory portion, the processing circuitry causes the data to be written to the second memory portion.

In some embodiments, the processing circuitry 104 may process a first few write requests of a data stream, which are directed to store the associated data of each of each respective write request of the first few write requests to a first memory portion. However, in such embodiments, after processing the first few write requests of the data stream, processing circuitry may then receive a subsequent write request of the data stream and based on the characteristic of at least the subsequent write request, processing circuitry selects to write the data associated to the subsequent write request in the second memory portion. The processing circuitry may make such a selection based on a characteristic of each of the first few write requests as well as the subsequent write request. In such an embodiment, the data associated with the first few write requests are to be moved or transferred from the first memory portion to the second memory portion. In addition, each additional write request received from the data stream is to be processed by the processing circuitry 104 and the data of each additional write request stored in the second memory portion of the memory.

Figure 5:
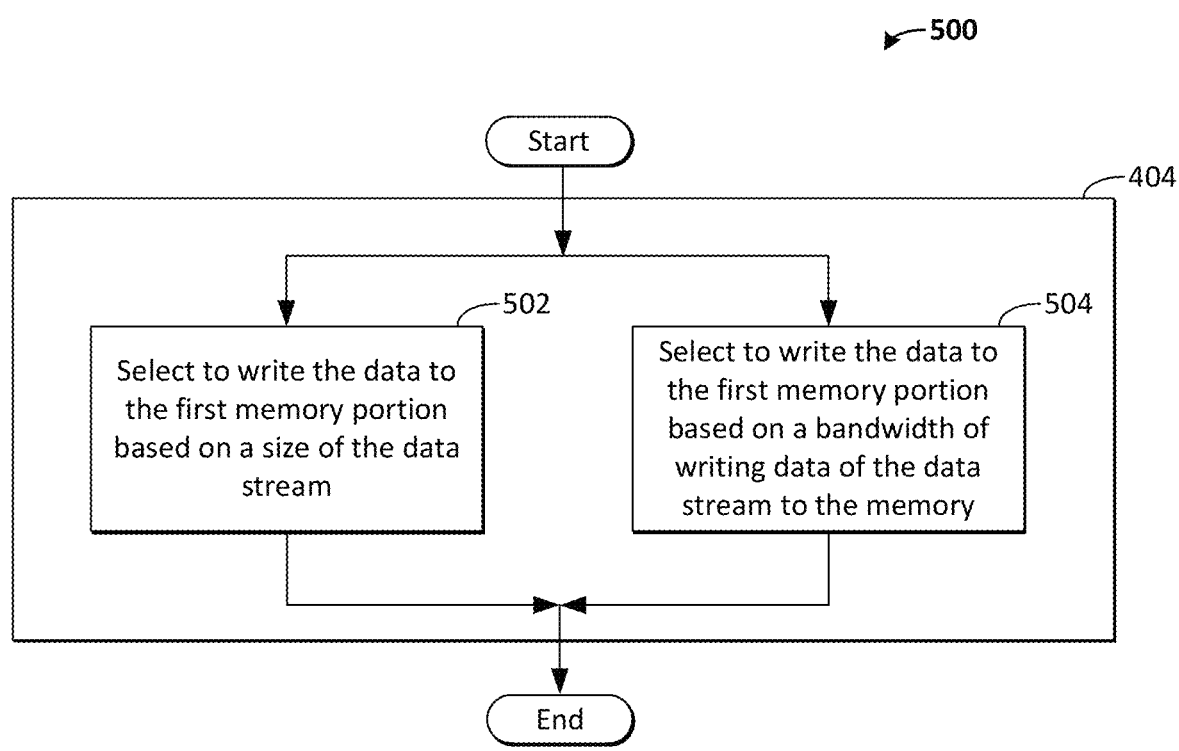
FIG. 5 shows a flowchart of illustrative steps of a sub-process for selecting to write the data to the first memory portion based on a characteristic of the data stream, wherein both the first memory portion and the second memory portion are available to be written to, in accordance with some embodiments of the present disclosure.

FIG. 5 shows a flowchart of illustrative steps of a subprocess 500 for selecting to write the data to the first memory portion based on a characteristic of the data stream, wherein both the first memory portion and the second memory portion are available to be written to (e.g., as seen in FIG. 4, at 404), in accordance with some embodiments of the present disclosure. In some embodiments, the referenced storage device, processing circuitry, memory, first memory portion, second memory portion, host, write request, and signal may be implemented as storage device 102, processing circuitry 104, and memory 106, first memory portion 202, second memory portion 204, host 108, write request 110, and signal 112, respectively. In some embodiments, the process 500 can be modified by, for example, having steps rearranged, changed, added, and/or removed. Processing circuitry 104 may perform subprocess 500 by selecting to write the data to the first memory portion based on a size of the data stream, at 502, or by selecting to write the data to the first memory portion based on a bandwidth of writing data of the data stream to the memory, at 504. At 502 and at 504, processing circuitry 104 selects the to write the data when each of the first memory portion and the second memory portion are available to be written to.

At step 502, the processing circuitry selects to write the data to the first memory portion based on a size of the data stream. The size of the data stream may be determined by the number of write requests within the data stream and the data size of the write requests. In some embodiments, the size of the data stream may be defined by the amount of memory space required to store the data stream. In some embodiments, processing circuitry 104 selects to write the data of a small data stream to a first memory portion, where the first memory portion includes a lesser-dense memory (e.g., SLC) than the second memory portion that includes MLC memory. Conversely, processing circuitry selects to write the data of a large data stream to a second memory portion, so to preserve the first memory portion for data streams that may require quick access reads once stored in memory 106.

At step 504, the processing circuitry selects to write the data to the first memory portion based on a bandwidth of writing data of the data stream to the memory. The bandwidth of writing data of the data stream to the memory may be determined by the rate of which write requests of the data stream are written to the memory and the data size of the write requests. In some embodiments, the bandwidth of writing data of the data stream to the memory may be constrained by the physical interconnections that are configured to couple the storage device to the host. In some embodiments, processing circuitry 104 selects to write the data of a high-bandwidth data stream to a first memory portion, where the first memory portion includes a lesser-dense memory (e.g., SLC) than the second memory portion that includes MLC memory. Conversely, processing circuitry selects to write the data of a low-bandwidth data stream to a second memory portion, so to preserve the first memory portion for data streams that may require quick access reads once stored in memory 106.

The terms "an embodiment", "embodiment", "embodiments", "the embodiment", "the embodiments", "one or more embodiments", "some embodiments", and "one embodiment" mean "one or more (but not all) embodiments" unless expressly specified otherwise.

The terms "including", "comprising", "having" and variations thereof mean "including but not limited to", unless expressly specified otherwise.

The enumerated listing of items does not imply that any or all of the items are mutually exclusive, unless expressly specified otherwise.

The terms "a", "an" and "the" mean "one or more", unless expressly specified otherwise.

Devices that are in communication with each other need not be in continuous communication with each other, unless expressly specified otherwise. In addition, devices that are in communication with each other may communicate directly or indirectly through one or more intermediaries.

A description of an embodiment with several components in communication with each other does not imply that all such components are required. On the contrary a variety of optional components are described to illustrate the wide variety of possible embodiments. Further, although process steps, method steps, algorithms or the like may be described in a sequential order, such processes, methods, and algorithms may be configured to work in alternate orders. In other words, any sequence or order of steps that may be described does not necessarily indicate a requirement that the steps be performed in that order. The steps of processes described herein may be performed in any order practical. Further, some steps may be performed simultaneously.

When a single device or article is described herein, it will be readily apparent that more than one device/article (whether or not they cooperate) may be used in place of a single device/article. Similarly, where more than one device or article is described herein (whether or not they cooperate), it will be readily apparent that a single device/article may be used in place of the more than one device or article, or a different number of devices/articles may be used instead of the shown number of devices or programs. The functionality and/or the features of a device may be alternatively embodied by one or more other devices which are not explicitly described as having such functionality/features. Thus, other embodiments need not include the device itself.

At least certain operations that may have been illustrated in the figures show certain events occurring in a certain order. In alternative embodiments, certain operations may be performed in a different order, modified, or removed. Moreover, steps may be added to the above-described logic and still conform to the described embodiments. Further, operations described herein may occur sequentially or certain operations may be processed in parallel. Yet further, operations may be performed by a single processing unit or by distributed processing units.

The foregoing description of various embodiments has been presented for the purposes of illustration and description. It is not intended to be exhaustive or to be limited to the precise forms disclosed. Many modifications and variations are possible in light of the above teaching.

What is claimed is:

1. A method for writing data of a data stream to a memory, the method comprising:
   receiving a write request to write the data to the memory, wherein the memory comprises a first memory portion of a first density and a second memory portion of a second density;
   causing the data to be buffered in the second memory portion; and
   after causing the data to be buffered in the second memory portion:
      determining to write the data to the first memory portion based on a size of the data stream and a bandwidth of the data stream, wherein both the first memory portion and the second memory portion are available to be written to, and
      causing the data to be written to the first memory portion.

2. The method of claim 1, wherein selecting to write the data to the first memory portion based on the characteristic comprises selecting to write the data to the first memory portion based on a size of the data stream.

3. The method of claim 1, wherein selecting to write the data to the first memory portion based on the characteristic comprises selecting to write the data to the first memory portion based on a bandwidth of writing data of the data stream to the memory.

4. The method of claim 1, wherein the selecting, and the causing are performed by a host system.

5. The method of claim 1, wherein the memory is part of a memory device comprising processing circuitry, and wherein the receiving, the selecting, and the causing are performed by the processing circuitry.

6. The method of claim 1, further comprising receiving a signal from a host indicative of the characteristic of the data stream.

7. The method of claim 1, wherein the first memory portion comprises single-level cells (SLC) and wherein the second memory portion comprises multi-level cells (MLC).

8. A system for writing data of a data stream, the system comprising:

memory comprising a first memory portion of a first density and a second memory portion of a second density;

processing circuitry configured to:
  receive a write request,
  cause the data to be buffered in the second memory portion, and
  after causing the data to be buffered in the second memory portion:
    determine to write the data to the first memory portion based on a size of the data stream and a bandwidth of the data stream, wherein both the first memory portion and the second memory portion are available to be written to, and
    cause the data to be written to the first memory portion.

9. The system of claim 8, wherein the processing circuitry is further to select to write the data to the first memory portion based on a size of the data stream.

10. The system of claim 8, wherein the processing circuitry is further to select to write the data to the first memory portion based on a bandwidth of writing data of the data stream to the memory.

11. The system of claim 8, wherein the processing circuitry is further to receive a signal from a host indicative of the characteristic of the data stream.

12. The system of claim 8, wherein the first memory portion comprises single-level cells (SLC) and wherein the second memory portion comprises multi-level cell.

13. A non-transitory computer-readable medium comprising instructions recorded thereon that, when executed, perform a method for writing data of a data stream to a memory, the method comprising:
  receiving a write request to write the data to the memory, wherein the memory comprises a first memory portion of a first density and a second memory portion of a second density;
  causing the data to be buffered in the second memory portion; and
  after causing the data to be buffered in the second memory portion:
    determining to write the data to the first memory portion based on a size of the data stream and a bandwidth of the data stream, wherein both the first memory portion and the second memory portion are available to be written to, and
    causing the data to be written to the first memory portion.

14. The non-transitory computer-readable medium of claim 13, wherein selecting to write the data to the first memory portion based on the characteristic comprises selecting to write the data to the first memory portion based on a size of the data stream.

15. The non-transitory computer-readable medium of claim 13, wherein selecting to write the data to the first memory portion based on the characteristic comprises selecting to write the data to the first memory portion based on a bandwidth of writing data of the data stream to the memory.

16. The non-transitory computer-readable medium of claim 13, the method further comprising receiving a signal from a host indicative of the characteristic of the data stream.

17. The non-transitory computer-readable medium of claim 13, wherein the first memory portion comprises single-level cells (SLC) and wherein the second memory portion comprises multi-level cell (MLC).

* * * * *